(12) United States Patent
Fournier et al.

(10) Patent No.: US 8,019,586 B2
(45) Date of Patent: Sep. 13, 2011

(54) HOLE QUERY FOR FUNCTIONAL COVERAGE ANALYSIS

(75) Inventors: Laurent Fournier, Givat Ella (IL); Avi Ziv, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 12/189,806

(22) Filed: Aug. 12, 2008

(65) Prior Publication Data

US 2010/0042385 A1 Feb. 18, 2010

Related U.S. Application Data

(63) Continuation of application No. 11/260,781, filed on Oct. 27, 2005, now Pat. No. 7,428,715.

(51) Int. Cl.
*G06F 17/50* (2006.01)
(52) U.S. Cl. ............... 703/14; 703/13; 714/738
(58) Field of Classification Search ............ 703/14, 703/13; 324/765; 714/741, 742, 726, 738; 716/4, 6
See application file for complete search history.

(56) References Cited

U.S. PATENT DOCUMENTS

| | | | | |
|---|---|---|---|---|
| 6,675,138 | B1 * | 1/2004 | Hollander et al. | 703/13 |
| 6,883,150 | B2 * | 4/2005 | Soltis et al. | 716/111 |
| 2001/0010091 | A1 * | 7/2001 | Noy | 716/4 |
| 2002/0002698 | A1 * | 1/2002 | Hekmatpour | 716/4 |
| 2003/0061581 | A1 * | 3/2003 | Baumgartner et al. | 716/4 |
| 2004/0025124 | A1 * | 2/2004 | Abe et al. | 716/4 |
| 2004/0133833 | A1 * | 7/2004 | Nozuyama | 714/738 |
| 2004/0216023 | A1 * | 10/2004 | Maoz et al. | 714/742 |
| 2004/0261043 | A1 * | 12/2004 | Baumgartner et al. | 716/4 |
| 2005/0010886 | A1 * | 1/2005 | Urata et al. | 716/6 |
| 2005/0081130 | A1 * | 4/2005 | Rinderknecht et al. | 714/726 |
| 2005/0102596 | A1 * | 5/2005 | Hekmatpour | 714/741 |
| 2005/0268265 | A1 * | 12/2005 | Ly et al. | 716/6 |
| 2006/0066339 | A1 * | 3/2006 | Rajski et al. | 324/765 |
| 2006/0155521 | A1 * | 7/2006 | Iwashita | 703/14 |

OTHER PUBLICATIONS

Lachish et al.,*Hole Analysis for Functional Coverage Data*, 39th Design Automation Conference, DAC 2002, New Orleans, Louisiana.
M. Karnaugh, *The Map Method for Synthesis of Combinational Logic Circuits*, Transactions of the American Institute of Electrical Engineers, 72(9):593-599, Nov. 1953.
J. R. Quinlan,*Inductions of Decision Trees*, Machine Learning, 1:81-106, 1986.
S. Fine and A. Ziv,*Enhancing the Control and Efficiency of the Covering Process*, in Proceedings of the High-Level Design Validation and Test Workshop, pp. 96-101, Nov. 2003.
Andrew Piziali, Functional Verification Coverage and Analysis, Kluwer Academic Publishers, 2004, Chapters 4 and 7.
Shai Fine and Avi Ziv, Coverage Directed Test Generation for Functional Verification Using Bayesian Networks, DAC 2003.

* cited by examiner

*Primary Examiner* — Kandasamy Thangavelu

(57) ABSTRACT

Functional coverage techniques during design verification using cross-product coverage models and hole analysis are enhanced by the use of coverage queries. After running a test suite, a core set of non-covered events is specified. A coverage query is then automatically constructed and executed on the test results to identify a hole in the functional coverage that satisfies conditions of the coverage query and includes the core set. The results of the query are presented as a simplified view of the coverage of the events in the cross-product space. Use of coverage queries allows a verification team to focus on specific areas of interest in the coverage space and to deal practically with highly complex coverage models. It also avoids the burden of producing and evaluating complete hole analysis reports.

13 Claims, 7 Drawing Sheets

HOLE QUERY FOR FUNCTIONAL COVERAGE ANALYSIS

This application is a continuation of U.S. patent application Ser. No. 11/260,781 filed on Oct. 27, 2005, currently issued as U.S. Pat. No. 7,428,715 on Sep. 3, 2008, the contents of which are incorporated herein in its entirety by reference.

BACKGROUND OF THE INVENTION

1. Field of the Invention

This invention relates to functional verification of a design. More particularly, this invention relates to tools for assessing coverage of functional verification tests.

2. Description of the Related Art

Despite advances in the area of formal verification, simulation techniques are still the cornerstone of the functional verification of processors and systems. These techniques involve running test programs in environments that simulate the actual design. The design is verified by comparing the test program results from such simulation environments with results expected from the design itself. A major concern in verification by simulation is assessment of the coverage of the testing performed up to a given point.

The main technique for checking and showing that the testing has been thorough is called test coverage analysis. Simply stated, the idea is to create, in a systematic fashion, a large and comprehensive list of tasks and check that each task was covered in the testing phase. Coverage analysis can help monitor the quality of testing and direct the test generators to create tests that cover areas that have not been adequately tested. For this purpose, test coverage tools attempt to create a large and comprehensive list of tasks and to check which tasks have been covered in the testing phase.

Most coverage tools provide two types of reports—status reports and progress reports. Progress reports show how coverage progresses over time. These reports are useful in detecting when the testing is "running out of steam" and predicting its potential coverage value. Status reports show which tasks are covered and which are not, and how many times each task was covered.

One method for this purpose involves discovering and reporting large non-covered spaces (herein referred to as "holes") in a cross-product model of the test domain. This sort of method is described in the document *Hole Analysis for Functional Coverage Data*, Lachish et al., 39$^{th}$ Design Automation Conference, DAC 2002, New Orleans, La. Holes in the coverage space expose gaps in the testing, which the user may then "plug" with additional tests. The authors describe a method for aggregating holes that are quantitatively similar, and specifically holes separated by a Hamming distance of one.

SUMMARY OF THE INVENTION

The invention provides a computer-implemented method for presentation of functional coverage of a design being verified, which is carried out by representing a set of attributes of the design as a multi-dimensional cross-product space of events corresponding to combinations of values of the attributes, running at least one test on the design, and identifying non-covered events in the test results. The method is further carried out by specifying a core set of the non-covered events, and performing a coverage query on the test results to identify a hole in the functional coverage by the test results that satisfies conditions of the coverage query and includes the core set. The method is further carried out by presenting the hole so as to display a simplified view of the coverage of the events in the cross-product space.

According to one aspect of the method, the coverage query includes a property of the test results.

In another aspect of the method, performing a coverage query includes performing an aggregation procedure that begins with the core set in order to identify the largest hole around the core set that satisfies the conditions of the coverage query.

In a further aspect of the method, performing a coverage query includes executing a clustering algorithm on the non-covered events in order to find a superset of non-covered events around the core set.

In yet another aspect of the method, performing a coverage query includes automatically identifying individual ones of the non-covered events and holes of the non-covered events that have a quantitative similarity.

According to still other aspects of the method, the quantitative similarity is measured according to a Hamming distance or a Lee distance.

In an additional aspect of the method, performing a coverage query includes grouping holes of the non-covered events that are similar according to a semantic partitioning of the values of the attributes.

Another aspect of the method includes preparing test directives, running at least one test in accordance with the test directives, and constructing the coverage query by including conditions of at least a portion of the test directives therein.

According to yet another aspect of the method, specifying a core set of the non-covered events is performed according to similarities in respective ones of the test directives with which the non-covered events are associated.

In still another aspect of the method, after performing the coverage query, test directives associated with the hole are identified.

In a further aspect of the method, performing a coverage query includes identifying a projected hole in the non-covered events.

According to one aspect of the method, the projected hole has a highest possible dimensionality.

Another aspect of the method includes identifying lightly covered sets of the events, wherein a percentage of covered events in the lightly covered sets is less than a predefined threshold, and identifying a projected hole in the lightly covered sets.

The invention provides a computer software product, including a computer-readable medium in which computer program instructions are stored, which instructions, when read by a computer, cause the computer to perform a method for presentation of functional coverage, which is carried out by representing a set of attributes of the design as a multi-dimensional cross-product space of events corresponding to combinations of values of the attributes, running at least one test on the design, and identifying non-covered events in the test results. The method is further carried out by specifying a core set of the non-covered events, and performing a coverage query on the test results to identify a hole in the functional coverage by the test results that satisfies conditions of the coverage query and includes the core set. The method is further carried out by presenting the hole so as to display a simplified view of the coverage of the events in the cross-product space.

The invention provides a computer system for presentation of functional coverage, including a processor, a memory for storing a representation of a set of attributes of a design being verified as a multi-dimensional cross-product space of events corresponding to combinations of values of the attributes. They system includes a simulator operative for running at least one test on the design, and a coverage tool executed by the processor and operative for identifying non-covered events in test results of the test, accepting a specification of a core set of the non-covered events, and performing a coverage query on the test results to identify a hole in the functional coverage by the test results that satisfies conditions of the coverage query and includes the core set. The system includes a display linked to the processor for presenting the hole so as to display a view of the coverage of the events in the cross-product space.

BRIEF DESCRIPTION OF THE DRAWINGS

For a better understanding of the present invention, reference is made to the detailed description of the invention, by way of example, which is to be read in conjunction with the following drawings, wherein like elements are given like reference numerals, and wherein.

DETAILED DESCRIPTION OF THE INVENTION

Figure 1:
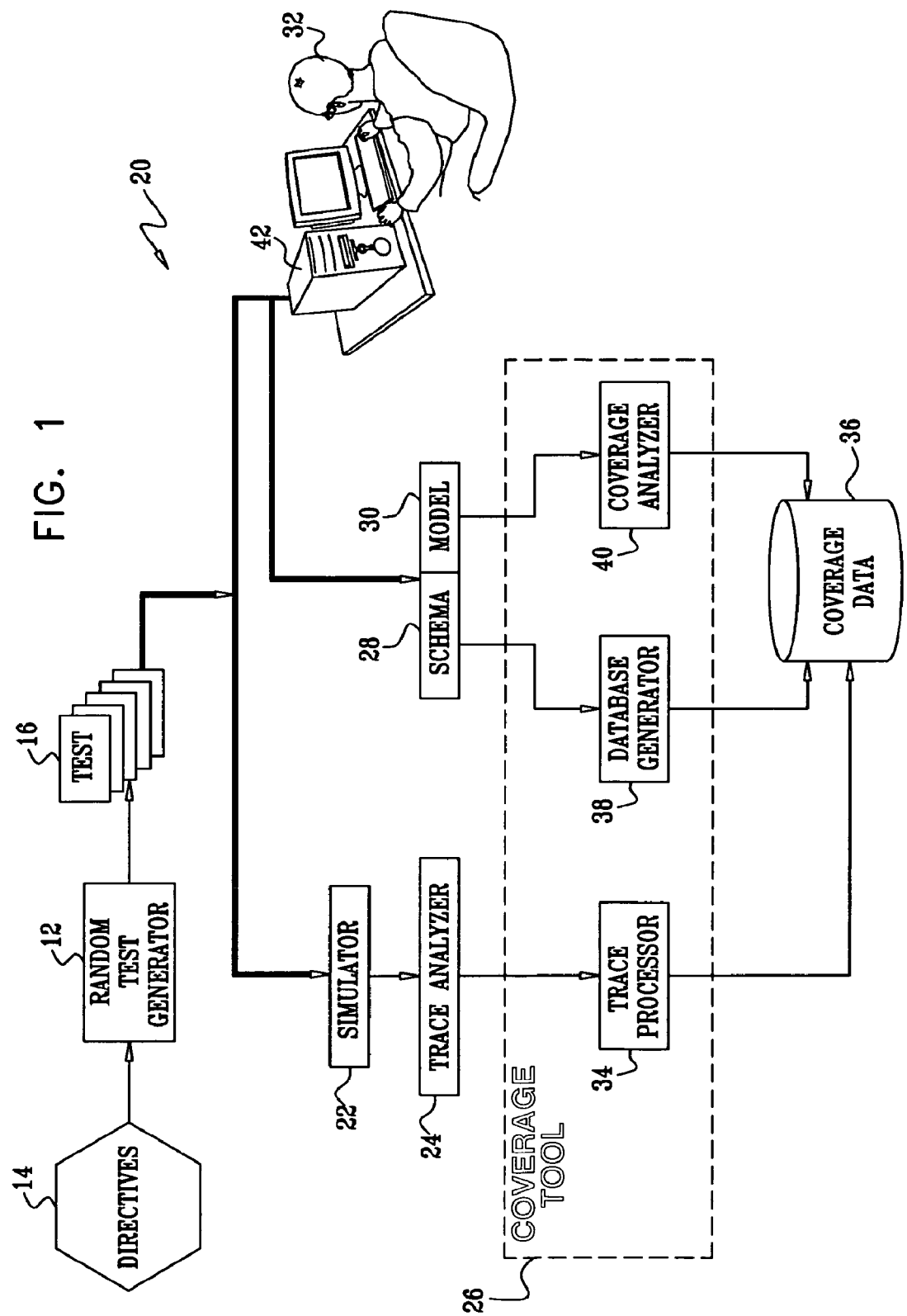
FIG. 1 is a block diagram of a system for functional coverage analysis, in accordance with a disclosed embodiment of the invention.

In the following description, numerous specific details are set forth in order to provide a thorough understanding of the present invention. It will be apparent to one skilled in the art, however, that the present invention may be practiced without these specific details. In other instances, well-known circuits, control logic, and the details of computer program instructions for conventional algorithms and processes have not been shown in detail in order not to obscure the present invention unnecessarily.

One of the main goals of coverage tools is to provide the user with an informative presentation of coverage information. Specifically, information on large, cohesive sets of non-covered tasks with common properties is useful in guiding the user to define additional tests to cover these tasks efficiently. In the present state of the art, this goal has not yet been satisfactorily achieved.

In a cross-product functional coverage model, the list of coverage tasks comprises all possible combinations of values for a given set of attributes. A simple example of a coverage model is all the possible combinations of requests and responses sent to a memory subsystem. In this case, a coverage task is the pair <request, response>, where "request" is any of the possible requests that can be sent to the memory, e.g., memory read, memory write, I/O read, I/O write. "Response" is one of the possible responses, e.g., ack, nack, retry, reject.

Hole analysis groups together sets of uncovered tasks that share some common properties, thus allowing the coverage tool to provide shorter and more meaningful coverage reports to the user. For example, it is much more helpful to report that a reject response never occurred, than it is to include all possible cases of a request with a reject response in the list of uncovered tasks. This grouping of uncovered tasks into meaningful sets shortens the list of uncovered tasks reported to the user, and provides vital information on the cause of the hole. Thus, investigation of the hole described above may lead to the simple conclusion that requests are never rejected because they do not arrive fast enough. In this case, increasing the rate of requests to the memory subsystem may be all that is needed to generate rejects.

According to disclosed embodiments of the invention, methods and systems use classification techniques to augment conventional hole analysis in order to provide concise information about uncovered and lightly covered areas in cross-product functional coverage models. Effective coverage models can be built hierarchically and through iterative refinement. Holes and restrictions are similarly expressed. Using these techniques, the learning curve for writing functional coverage models and for using hole analysis is reduced. Furthermore, the translation of holes into missing restrictions can often be automated.

In one aspect of the invention, a meaningful subset of the values of a certain attribute may be found, for example, I/O requests (including I/O read and I/O write). This type of hole detection leads to the discovery of rectangular holes that are parallel to the attribute axis.

According to some aspects of the present invention, hole analysis is enhanced by introduction of coverage queries. Coverage queries facilitate finding uncovered tasks that have common values in some of the attributes, and finding some common denominator in the attribute values that distinguish them. In the simplest case, not all the values of a specific attribute are covered when each of the other attributes has a particular value. The importance of coverage queries lies in the fact that they enable a verification team to focus their efforts on perceived areas of interest. In addition, the ability to perform coverage queries may alleviate the need for full hole reports, which can be time consuming.

System Overview.

Turning now to the drawings, reference is initially made to FIG. 1, which is a block diagram of a system 20 for functional coverage analysis, in accordance with a disclosed embodiment of the invention. A generic test generator engine 12 is influenced by input test directives 14. The influence of the directives 14 includes, for example, the identity of the test instructions generated, their parameters, relative order, and various events relating to the instructions. The test generator engine 12 produces a suite of test programs 16 for a design under test. A simulator 22 runs the test programs 16, and a trace analyzer 24 generates trace files, containing lists of events that occurred during testing. (An "event" in this context, as explained above, is a particular combination of values of attributes of the design under test, which corresponds to an entry in the trace file in the embodiment of FIG. 1.) The trace files are processed by a coverage tool 26 in order to track the coverage of the testing program.

To process and display the coverage results, the coverage tool 26 typically uses a schema 28 and a coverage model 30 that are provided by a user 32 of the tool. The schema is a list of attributes that defines the part of the design to be tested, and thus defines the area over which the test coverage is to be measured by the tool 26. Each attribute has a bounded set of values, which is referred to as the attribute domain. The model, which is based on the schema, represents the space of events that are of interest in evaluating the test coverage and indicates which events are legal. Since each event is specified by multiple attributes, the cross-product space in which the model is defined is typically multi-dimensional. In order to simplify the presentation of the model, the user may choose projections of the model that allow the model to be more readily visualized in two-, three- or n-dimensional space, wherein n is the number of the attributes in the projection. Additionally or alternatively, the user may select certain subdomains or partitions of the model for analysis and presentation.

In this exemplary embodiment, the coverage tool 26 comprises a trace processor 34, which arranges the coverage information from the trace files into a coverage database 36, which is held in a suitable memory. The organization of the database 36 is determined by a database generator 38, based on the schema 28. As testing by the simulator 22 progresses, the trace analyzer 24 and trace processor 34 add data to the coverage database 36, indicative of the events that have been covered. A coverage analyzer 40 processes the information in the coverage database and, using the model 30, presents the coverage model on an output device 42, such as a terminal display or a printer. Based on this presentation, the user 32 is able to identify holes in the coverage that has been achieved, as well as blocks of events that have been covered, at various points in the course of testing by the simulator 22. The user may then specify additional tests to be performed by simulator 22 in order to plug holes that remain in the coverage model. Additionally or alternatively, the coverage model may be applied by an automatic test generator, either autonomously or under the guidance of a user, in generating additional tests.

Typically, the coverage tool 26 comprises one or more general purpose computer processors, which are programmed in software to carry out the functions described herein. The software may be downloaded to the processor in electronic form, over a network, for example, or it may alternatively be supplied on tangible media, such as optical, magnetic or electronic memory media. The different functional elements of the coverage tool may be implemented as different processes running on the same computer, or they may alternatively be divided among different computers. Furthermore, these elements may be integrated with other components of the system 20 on a single computer. Alternatively, some or all of these elements may be implemented in dedicated hardware or on a combination of hardware and software components.

Functional Coverage Model.

Functional coverage focuses on the functionality of an application. It is used to check that all important aspects of the functionality have been tested. Unlike code coverage models that are program based, functional coverage is design and implementation specific. When using functional coverage, coverage models containing a large set of verification (coverage) tasks are systematically defined by the user. These are used to measure, monitor, and redirect the testing process. Holes in the coverage space expose gaps in the testing, and new tests are created to plug these gaps. This is an iterative process, in which the quality of the testing is continuously measured, and improvements to the testing are suggested when analyzing the results of the measurement.

Functional coverage models are composed of four components. The main component is a semantic description (story) of the model. The second component is a list of the attributes mentioned in the story. The third component is a set of all the possible values for each attribute. The last component is a list of restrictions on the legal combinations in the cross-product of attribute values.

As an example, the above-mentioned article by Lachish et al. describes a coverage model of a floating point processor. The elements of the model are shown below in Table 1:

TABLE 1

Attributes of Floating Point Model

| Attr | Description | Values |
|---|---|---|
| Instr | Opcode of the instruction | fadd, fadds, fsub, fmul, fdiv, fmadd, fmsub, fres, frsqrte, fabs, fneg, fsel, . . . |
| Result | Type of result | ±0, ±MinDeNorm, ±DeNorm, ±MaxDeNorm, ±MinNorm, ±Norm, ±MaxNorm, ±∞, SNaN, QNaN, none |
| Round Mode | Rounding mode | toward nearest, toward 0, toward +∞, toward −∞ |
| Round Occur | Did rounding occur? | True, False |

The model consists of four attributes—Instr, Result, Round Mode, and Round Occur—each with the possible values shown. The semantic description of the functional coverage model is: test that all instructions produce all possible target results in the various rounding modes supported by the processor both when rounding did and did not occur. Each attribute may be partitioned into one or more disjoint sets of semantically similar values. This provides a convenient way for users to conceptualize their model and for analysis tools to report on coverage data. In Table 2, which gives several partitioning examples, the instruction attribute is partitioned into arithmetic instructions and non-arithmetic instructions, or according to the number of input operands. The result attribute is partitioned according to the sign of the result, and so on.

TABLE 2

Attribute Partitions (Partial List)

| Attribute | Partition | Values |
|---|---|---|
| Instr | Arith | fadd, fsub, fmul, fdiv, . . . |
|  | Non Arith | fabs, fneg, fmr, fsel, . . . |
| Instr | 1 Operand | fabs, fneg, fres, frsqrte, . . . |
|  | 2 Operands | fadd, fsub, fmul, fdiv, . . . |
|  | 3 Operands | fmadd, fmsub, fsel, . . . |
| Result | Positive | +0, . . . , +Norm, . . . , +∞ |
|  | Negative | −0, . . . , −Norm, . . . , −∞ |
|  | Not A Number | SNaN, QNaN |

Restrictions for this model are shown in Table 3. They describe combinations of attribute values that should never occur, for example, the result of a fabs instruction cannot be negative. The coverage model described here has been used to check the coverage of tests generated for the floating point unit of several PowerPC® processors.

TABLE 3

Restrictions for the Floating-Point Model

| Name | Description |
|---|---|
| Arith-SNaN | Instr ∈ Arith ⇒ Result ≠ SNaN |
| NonArith-Round | Instr ∉ Arith ⇒ Round Occur = 0 |
| Abs-Nabs | Instr = fabs ⇒ Result ∉ Negative AND<br>Instr = fnabs ⇒ Result ∉ Positive |

Functional coverage models come in many flavors. Models may cover the inputs and outputs of an application (black box), or may look at internal state (white box). Functional coverage models may be either snapshot models, which check the state of the application at a particular point in time, or temporal models, whose tasks correspond to the application's state as it evolves.

The cross-product technique is not the only way to define functional coverage models. Other types of coverage models include collections of discrete events, trees, and hybrids that combine trees and cross-product. Still, our experience indicates that cross-product models are more efficient than the alternatives in providing a systematic description of the desired coverage space.

Creating a Functional Coverage Model.

The first step in the functional coverage process is the design of the coverage model. This is typically done by isolating "interesting" attributes of the application and building a story around them.

For coverage to impact positively on the testing process, models should cover areas that are considered risky or error prone. The size of the model (number of legal tasks) should be chosen in accordance with testing resources. The model size should not be so large as to make it difficult to cover or impractical to analyze. Constructing a good coverage model requires functional coverage skills and domain-specific knowledge.

The part of the model most difficult to define correctly is the model restrictions. Often a deep understanding of the specification, design, and implementation is needed to create correct restrictions. While creating restrictions, designers may need to think of how the system operates in ways not previously considered. This process turns out to be useful in itself, as it increases understanding of the application.

Refining the Functional Coverage Model.

Figure 2:
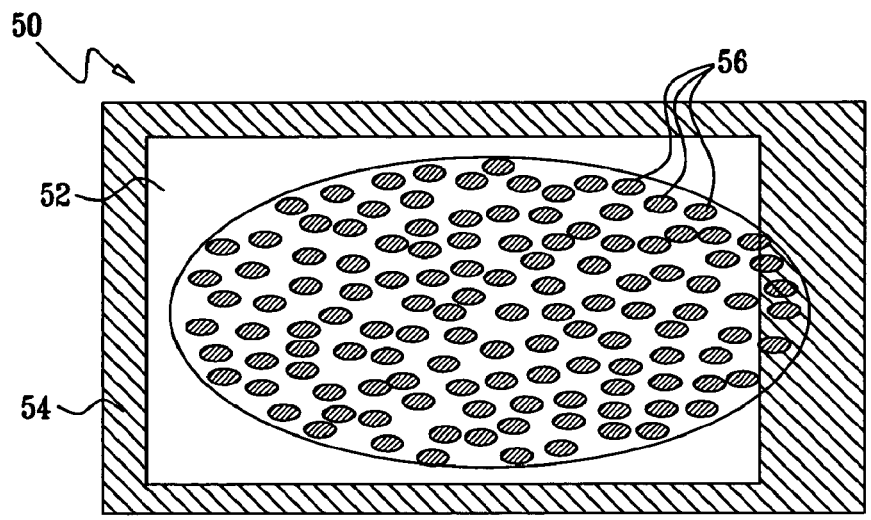
FIG. 2 is a schematic diagram of a coverage model in accordance with a disclosed embodiment of the invention.

Reference is now made to FIG. 2, which is a schematic of a coverage model 50 in accordance with a disclosed embodiment of the invention. Every task in the cross-product of a modells attribute values is either legal, falling in a white area 52, or illegal, falling in a shaded area 54. Tasks within the coverage space either have been covered, indicated by dots 56, or remain uncovered. Uncovered legal tasks are holes in the coverage model. Sometimes after careful analysis, it is determined that a hole is in fact an illegal task, and additional restrictions need to be introduced into the model to eliminate the hole. Conversely, illegal tasks that have been covered either are actual bugs in the application, or reflect a coverage model that is overly restrictive. Thus, the definition of a coverage model is dynamic, with tasks occasionally drifting between being legal and illegal as the application is better understood, and the model is refined. In practice, actual bugs in the application are rare, and covered illegal tasks usually reflect problems in the model definition. Holes, in contrast, are more common, and are as likely to result from inadequate testing as from missing restrictions in the model.

The size of a model's cross-product is determined by the number of its attributes and the number of values for each attribute. Consequently, the number of tasks in a functional coverage model can be quite large, making the model difficult to cover and analyze. One way to reduce the size of a model is to define restrictions that eliminate illegal tasks.

Figure 3:
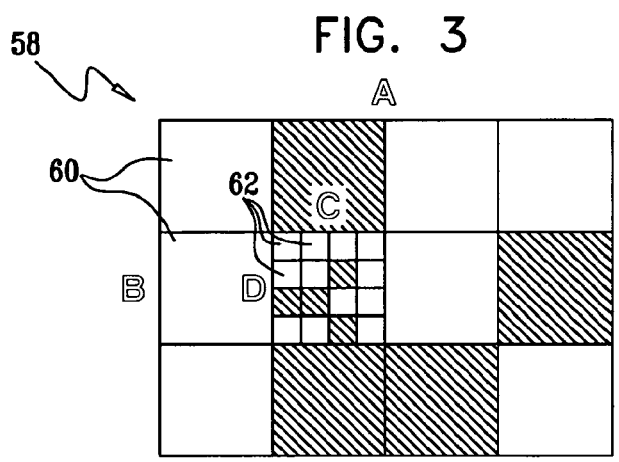
FIG. 3 is a diagram illustrating an approach for reducing the size of a coverage model, in accordance with a disclosed embodiment of the invention.

Reference is now made to FIG. 3, which is a diagram illustrating an alternative approach for reducing the size of a coverage model, in accordance with a disclosed embodiment of the invention. The approach taken is to start with a coverage model 58 that has relatively few attributes. In the floating point domain, for example, an initial model may consider just the two attributes, Instr and Result, indicated by large squares 60 that correspond to dimensions A and B. Restrictions for such models are simpler both to write and refine. Once these smaller coverage models have been satisfactorily defined, their restrictions can be applied to more comprehensive models, indicated by addition of the dimensions C and D, represented by small squares 62 that are embedded in the squares 60. This hierarchical approach to modeling makes it quicker to define restrictions and to adjust the coverage model to the simulation resources.

Hole Analysis.

Once the functional coverage model has been defined and coverage of tests has been measured, the next step in the verification process is to analyze the coverage data. A critical aspect of the coverage analysis is to determine those areas of the application that have not-been adequately tested. While most coverage tools are able to report individual uncovered tasks, it remains the function of hole analysis to discover and concisely present information about meaningful holes. Holes are considered meaningful either because they represent a relatively large number of uncovered tasks, or because they correspond to a set of tasks that have some semantic coherency. A presentation of a number of techniques for discovering such quantitatively and conceptually meaningful holes follows.

Figure 4:
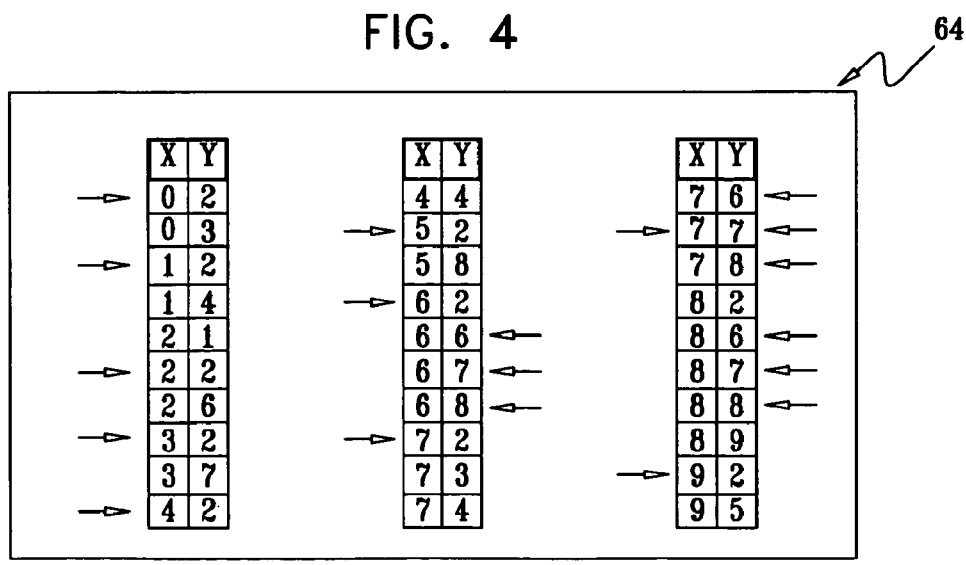
FIG. 4 is a tabular presentation of an exemplary coverage report in accordance with a disclosed embodiment of the invention.

Reference is now made to FIG. 4, which illustrates an exemplary coverage report 64 in accordance with a disclosed embodiment of the invention. The coverage report 64 has just two integer attributes, X and Y, each capable of taking on values between 0 and 9. FIG. 4 shows the individual uncovered tasks. This is typical of the results that can be obtained from conventional coverage analysis tools. Not immediately obvious are two meaningful holes that exist in the coverage data, shown with arrows in the figure. A first hole occurs whenever the attribute Y equals 2, and a second hole exists when both attributes have values 6, 7, or 8.

Figure 5:
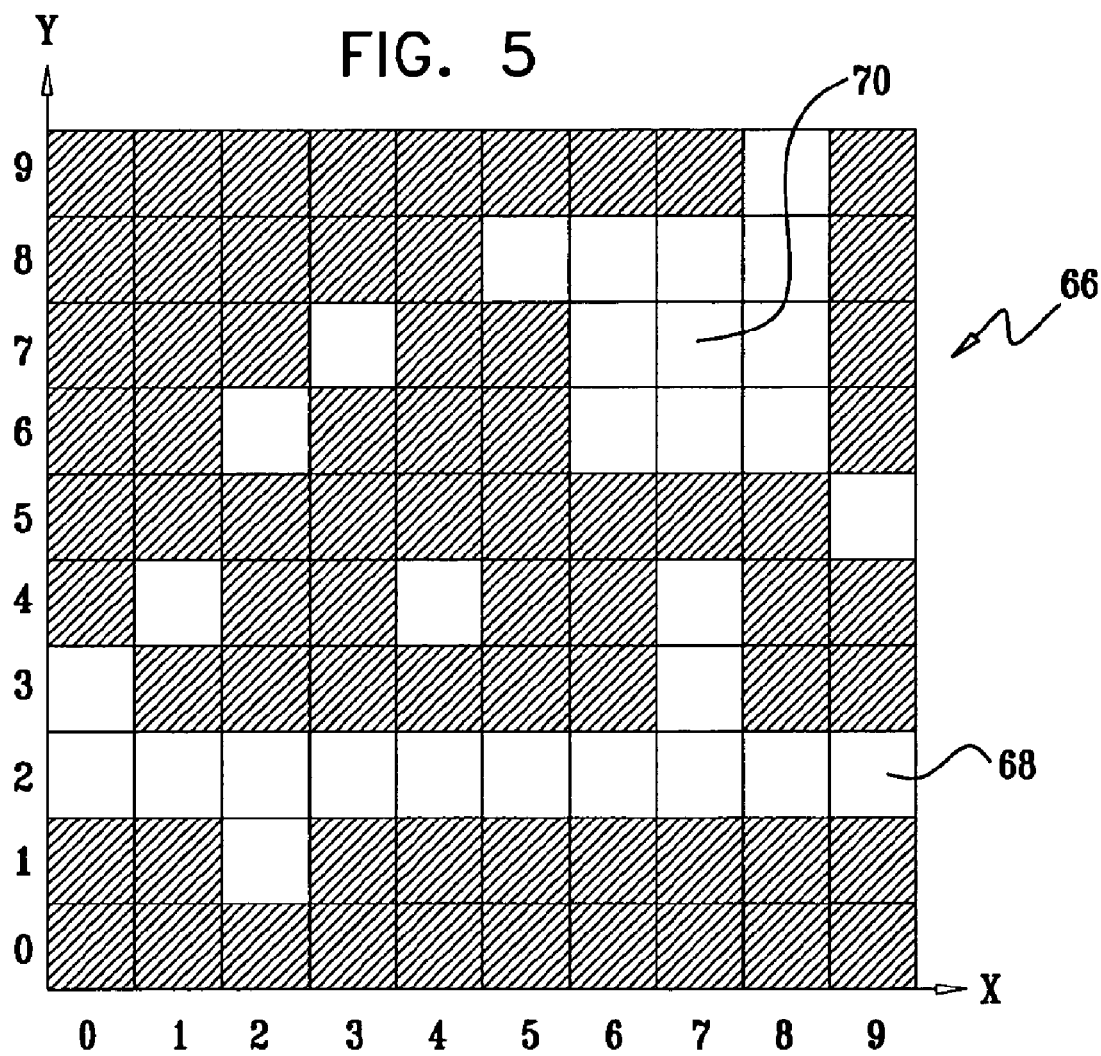
FIG. 5 is a graphical presentation of the coverage report shown in FIG. 4 in accordance with a disclosed embodiment of the invention.

Reference is now made to FIG. 5, which is a graphical presentation 66 of the coverage report 64 (FIG. 4), in accordance with a disclosed embodiment of the invention. In the figure, covered events are marked as black squares and uncovered events are marked as white squares. The first and second holes are readily seen as areas 68, 70, respectively. Such graphs, which can be obtained using the tools disclosed herein, provide a convenient way to present holes that are clustered along ordered values in models with a small number of attributes. The challenge for hole analysis is to discover more complex holes in arbitrarily large models, and to present these holes in such a way that their root cause may be more easily discerned. Coverage queries according to the present invention, described below, enhance conventional hole analysis and go far to meet this challenge.

Aggregated Holes.

Meaningful holes can be automatically discovered between uncovered tasks that are quantitatively similar, that is, their similarity or dissimilarity is measurable by a metric. A simple metric for similarity is the Hamming distance between two holes. This corresponds to the number of attributes on which the two differ. The distance will be one for holes that differ in only one attribute, two for holes that differ in two attributes, and so on, up to the number of attributes in the coverage space. We aggregate together any two holes whose Hamming distance is one. Thus, the two uncovered tasks <0,2> and <0,3> from FIG. 4 can be aggregated into the single hole <0,:{2,3}>. Another suitable metric is the Lee distance.

Hamming distances can be also computed on aggregated holes. Again, the distance between any two holes is equal to the number of differing attributes, but now the comparison is done for aggregated sets as well as atomic values. The process can be applied iteratively until no more new aggregated holes are discovered. Table 4 shows how the five tasks <0,2>, <0,3>, <7,2>, <7,3>, and <7,4> from FIG. 4 can be aggregated together until only the holes <{0,7};{2,3}> and <7;{2,3,4}> remain. This technique is similar to Karnaugh binary mapping and is useful for much the same reasons. Karnaugh binary mapping is described in the document, *The Map Method for Synthesis of Combinational Logic Circuits*, M. Karnaugh, Transactions of the American Institute of Electrical Engineers, 72(9):593-599, November 1953.

TABLE 4

Aggregated Holes Calculation.

| <0, 2> | ⇒ | <{0, 7}, 2> | ⇒ | <{0, 7}, {2, 3}> |
|---|---|---|---|---|
| <0, 3> |  | <{0, 7}, 3> |  |  |
| <7, 2> |  | <0, {2, 3}> |  | <7, {2, 3, 4}> |
| <7, 3> |  | <7, {2, 3, 4}> |  |  |
| <7, 4> |  |  |  |  |

Partitioned Holes.

A second technique for performing hole analysis is to group together holes that have been defined to be conceptually similar. Grouping is done according to semantic partitioning of the attribute values provided by the user when defining the coverage model. Attribute values that are partitioned together are frequently tested together, and holes in one value may occur for the whole group.

Grouping is used to describe larger holes and to provide more focus on the meaning of the holes. For example, the second hole in Table 5 is a grouping of many smaller holes. This grouping allows us to detect the common denominator (and perhaps the common cause) of all the sub-holes, that none of the instructions in the SquareRoots group produced denormalized results. After some analysis, it was determined that square root instructions in fact should not produce such results, and the hole was converted into a restriction in the coverage model.

TABLE 5

Coverage Holes Report

| Instr | Result | Round Mode | Round Occur | Hole Size |
|---|---|---|---|---|
| fadd | * | * | * | 152 |
| Square Roots | +DeNorm +MaxDeNorm +MinDeNorm | * | * | 72 |

TABLE 5-continued

Coverage Holes Report

| Instr | Result | Round Mode | Round Occur | Hole Size |
|---|---|---|---|---|
| Estimates | * | * | True | 144 |
| * | ±MaxDeNorm | * | True | 263 |

Both aggregated and partitioned holes look to combine individual, uncovered tasks into larger holes that in turn can suggest reasons for the observed gaps in coverage. In both cases, similarity between tasks is used to determine which tasks should be combined.

The difference between the two is that the similarity among partitioned holes is semantic and based upon groupings provided by the user, whereas for aggregated holes it is quantitative and discovered automatically by the tool.

Projected Holes.

Consider the first hole described in Table 5, which has the specific value fadd for the instruction attribute and wild cards in all the other attributes. This hole denotes that not all the tasks with fadd are covered and it describes 152 tasks. We call this a projected hole. The dimension of a projected hole is the number of attributes in it that do not have specific values.

Any coverage model of n attributes can be viewed as a set of tasks or points in an n-dimensional space. Viewed as such, a projected hole of dimension 1 contains tasks that lie on a line in hyperspace. A projected hole of dimension 2 describes tasks that lie on a plane, and so on. A projected hole of a higher dimension subsumes all holes of a lower dimension that it contains. For example, the hole $p=<*,*,x_3 \ldots, x_n>$ of dimension 2 contains all the tasks described by the subspace $q=<*,*,x_3 \ldots, x_n>$. In such a case, we say that p is the ancestor of q, and that q is the descendant of p.

In general, the higher the dimension, the larger and, therefore, more meaningful the hole it describes. Since a hole of higher dimension is both more informative and more concise than the holes it subsumes, it becomes unnecessary, and in fact redundant, to report on the latter.

One goal of hole analysis is to find projected holes of the highest possible dimensionality in said uncovered events. The algorithm shown in Listing 1 first iterates over all covered events and marks them and all their ancestors. Next, it iterates over all potential holes, starting with those of the highest dimensionality (<*,*, . . . , *>). Any subspace that is unmarked is reported as a significant hole and its descendants are recursively marked.

A projected hole is considered lightly covered if the percentage of tasks subsumed that have been covered is less than some given threshold. It is fairly easy to adapt the projected holes algorithm to report on lightly covered holes.

Another effective approach is to use a classification algorithm, such as the well known ID3 algorithm, described in the document *Inductions of Decision Trees*, J. R. Quinlan, Machine Learning, 1:81-106, 1986 to find projected holes. Most classification algorithms use some kind of entropy measurement on the data to guide the construction of the decision tree used in the classification. In our case, the target function is the coverage data and the ID3 algorithm is used to find a large cluster of uncovered tasks.

Table 5 shows some of the holes found in the floating point model when the model was as part of a test plan. The first hole indicates that none of the tasks related to the fadd instruction was covered. The hole was caused by a bug in the specification to the test generator that omitted the fadd instruction from the list of instructions that needed to be generated.

The next two holes show two groups of tasks that cannot be achieved. The first points to square root instructions (fsqrt, fsqrts, frsqrte) with small results, while the second points to estimation instructions (fres, frsqrte) with inexact results. Both holes are covered by restrictions that eluded the developer of the model. After their detection, the two holes were converted to restrictions. The last hole in the list corresponds to a group of tasks with specific results and rounding that was hard to generate, and was therefore only lightly covered (less than 10 percent). This hole was filled by enhancing the capabilities of the test generator.

A significant feature of the coverage tools according to the present invention is that the language used to report holes is equivalent to the one used by the user for defining restrictions. The hole <Arith,SNaN,*,*>, for example, is expressed by the restriction Instr∈Arith⇒Result≠SnaN. This means that holes can be easily translated into restrictions if necessary. In many cases, the translation can be automated.

Coverage Queries.

There are significant drawbacks of conventional hole analysis: (1) Conventional hole analysis provides a global view of the coverage data, while in many cases the verification team needs to focus on specific area. (2) The computational complexity of hole analysis may be too great for practical evaluation by the verification team. In order to remedy these drawbacks, the invention provides a coverage feature called a "coverage query". This feature provides the capability to query for a meaningful hole, with a given set of non-covered events as its core, which may be a single event or a plurality of events. As mentioned above, depending on the semantics of the coverage model and on the capacity of the event generator, the term meaningful can amount to different properties, e.g., a maximal value, or the possession of some characteristics, e.g., including (or excluding) specific sets of events. The importance of coverage queries lies in the fact that they enable a verification team to focus their efforts on perceived areas of interest. In addition, the ability to perform coverage queries may alleviate the need for full hole reports, which can be time consuming.

Definition of the query is comprised of two parts: definition of a core set of events that are of interest, and definition of the requested properties of the hole. The core set, which can be a single event, is generally specified by a human operator, who typically applies domain-specific knowledge to focus on areas of interest. A command line interpreter or a simple GUI mechanism can be used to specify the core set. Such mechanisms can also be used to select the properties of the requested hole. For example, the operator may interact with a selection box or menus.

Figure 6:
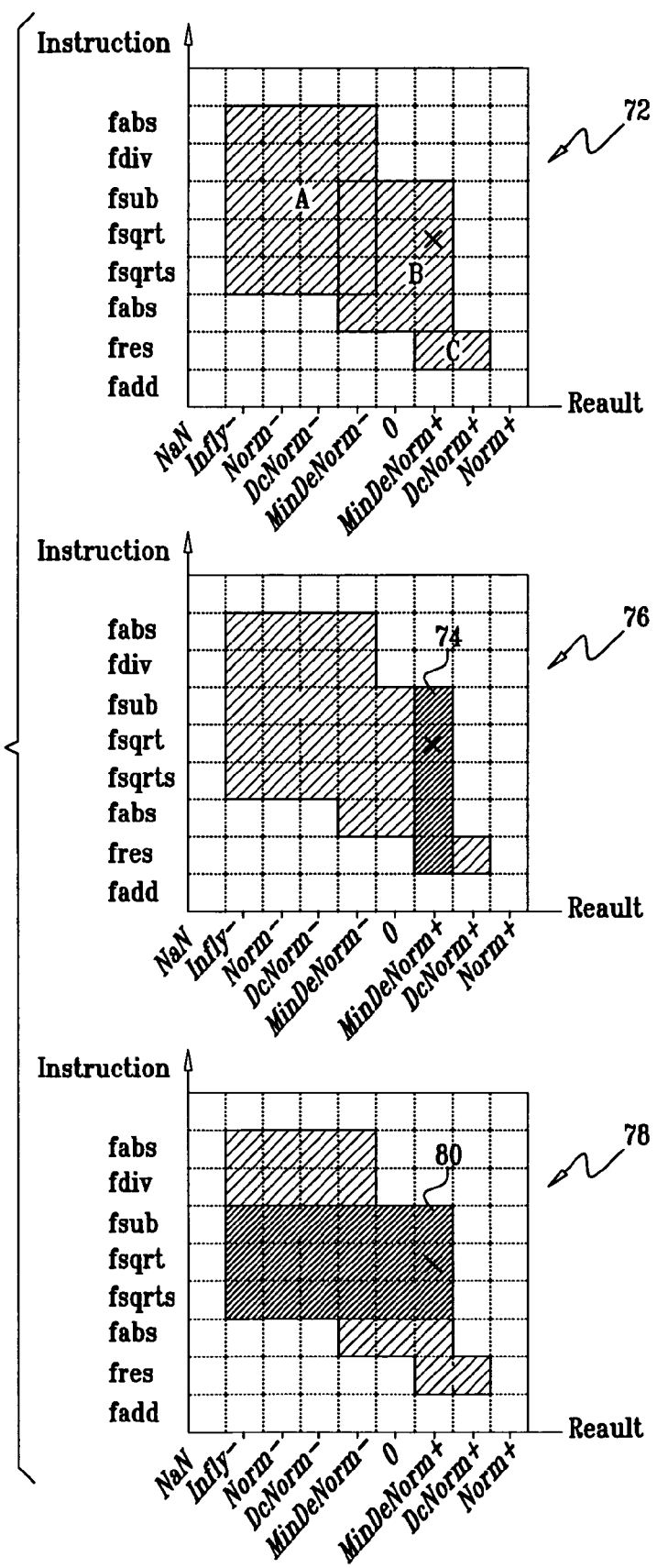
FIG. 6 is a graphical presentation of an exemplary coverage query in accordance with a disclosed embodiment of the invention.

Reference is now made to FIG. 6, which is a graphical presentation of an exemplary coverage query in accordance with a disclosed embodiment of the invention. The graphs show part of the coverage space of the floating-point model described in Table 1, projected over the Instruction and Result attributes. Shaded areas in the graphs represent non-covered events. A leftmost graph 72 shows the holes found by a hole analysis algorithm. The report includes three holes referenced A, B, and C. This result is not unique and there are other ways to report holes on this space with the same non-covered events.

For a specific interesting non-covered event, <fsqrt, +MinDeNorm>, marked x in the graph 72, a user may be interested in a hole containing this event that includes the maximal number of instructions. One possible reason for such a query is that controlling the generated instructions in the stimuli generator is easier than controlling the result of the instruction. The result of this coverage query with maximal number of instructions is marked in a middle graph 74 as a dark shaded area 76. This hole contains five non-covered events, with five different instructions and the same result (+MinDeNorm). The result of the coverage query with the same core event and maximal number of non-covered events is shown in a rightmost graph 78 as a hole represented by a dark shaded area 80. This hole contains 15 non-covered events (three instructions times five results). Note that the results of the two queries are not shown as holes in the hole analysis report in the graph 72.

The coverage query is an extension of the simple methodology currently used by most verification teams. The most common conventional methodology is to go over the list of non-covered events and take care of each of them individually. This includes two steps: first, understanding the underlying reasons for their non-covered state, and then coming up with the appropriate testing to maximize the probability of covering each one separately. The coverage query is an improvement over this methodology in two ways: First, the hole associated with the non-covered core event can provide additional hints to the verification team regarding the cause of the hole. In addition, developing appropriate testing to cover holes instead of individually developing tests for many events can lead to a shortened period for realizing the desired coverage goals.

A straightforward way to implement the coverage query is to grow the query results from the core events, based on the query requirements. For example, to find the largest hole containing a set of non-covered events, which can be a single core event, we can start with the set of non-covered events and use the aggregation technique described in the above-noted Lachish document to find the largest hole around the set of non-covered events that satisfies the condition of the query. The decision on the growth direction can be influenced by the query requirement and specific semantic knowledge.

Another method involves using clustering algorithms to find a superset of non-covered events around the set of non-covered events. The distance measure for the clustering algorithm can reflect the specific query requirements and the semantics of the coverage model. For example, the Lee distance or Hamming distance can be used to find the largest cluster (and thus the largest hole) around a core event.

Coverage Queries in Test Directive Domain.

Referring again to FIG. 1, a special case for the above-mentioned method of finding supersets occurs when the clustering is done based on measures in the test directive domain, as described in the document *Enhancing the Control and Efficiency of the Covering Process*, S. Fine and A. Ziv, in Proceedings of the High-Level Design Validation and Test Workshop, pages 96-101, November 2003. Constructing coverage queries using conditions in the test directive domain enables holes to be discovered that are meaningful in terms of the capabilities of the test generator engine 12, and facilitates modifications of the directives 14 in order to improve coverage of these holes in subsequent test runs.

Of course, in constructing the directives 14 for the test generator engine 12, it is desirable to exploit available a priori knowledge, e.g., ordering events based on their difficulty of coverage, and exploiting available semantic (domain) knowledge e.g., partitioning the coverage space into sub-regions of events that share some semantic proximity, such as error events. In defining clusters, the proximity of events is not determined solely by their semantics, but also by the way the simulation environment stimulates them.

In the approach taken, grouping of elements in one space is determined by the proximity of related elements in a different space; coverage events are grouped together if their associated stimuli are similar. Thus, the resulting clusters group together events that share a typical context, which in turn can be interpreted as their latent cause. This notion of proximity yields a target oriented clustering. In other words, proximity among events is indicated by the similarity of the designed directives.

In exemplary simulation environments, the directives 14 may be sets of numeric values selected from prescribed ranges, which constitute parameters of the tests that are generated by the test generator engine 12. For example, the values could be weights that bias the random test generator, or which enable or disable flags. It will be understood that the invention is by no means limited to such numerical cases, and that the directives can be created in many ways, based on other modifiable characteristics of the test generator engine 12 and the test programs 16.

A metric space is one appropriate choice in which to embed the directives 14, measure similarity, and cluster together events that are associated with similar directives, using known cluster analysis techniques. Once having partitioned the events, a subset of directives is selected from the set of directives in each cluster. Membership in a subset is based on similarities of a member's directives to the directives of other members of the cluster.

Figure 7:
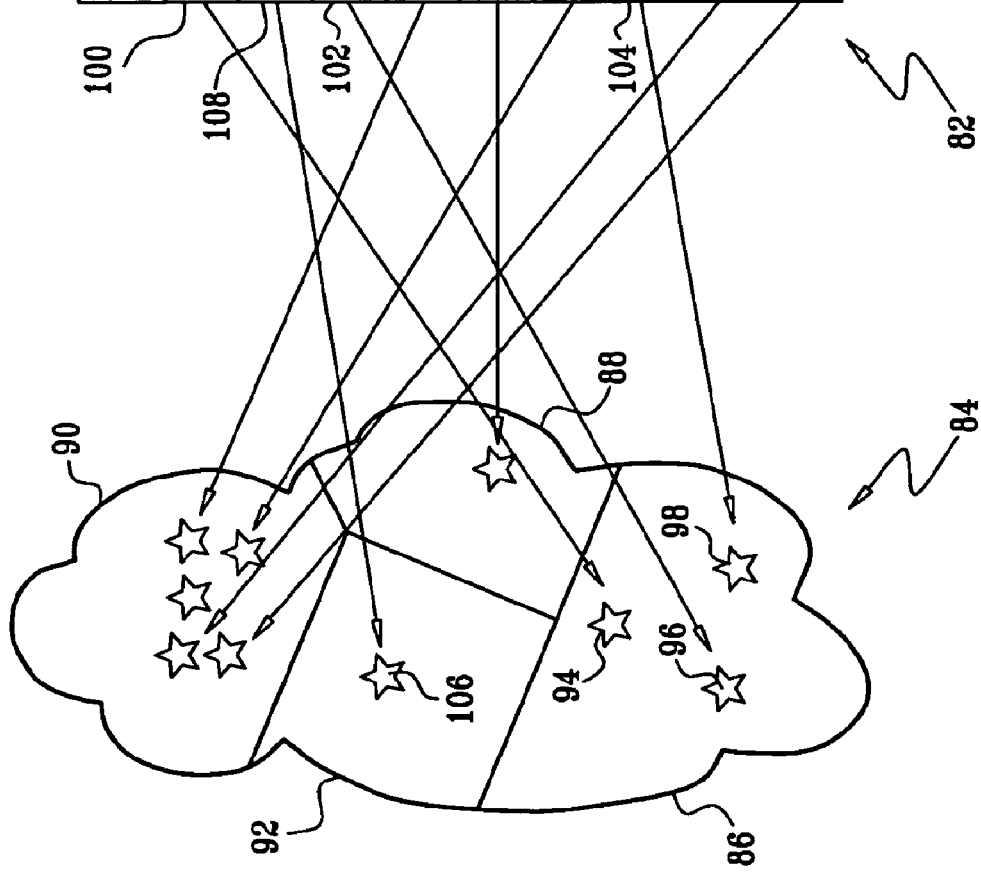
FIG. 7 is a schematic diagram illustrating a clustering of test directives in accordance with a disclosed embodiment of the invention.

Reference is now made to FIG. 7, which is a schematic diagram illustrating the clustering of directives just described. A table 82 lists a set of non-covered events. Initially the table 82 includes all events of the coverage space. In subsequent iterations, the table 82 is re-constructed from coverage analysis. The directives that map to the events of the table 82 form a directive space 84, in which individual directives are represented by stars. The directive space 84 is partitioned into a plurality of clusters 86, 88, 90, 92. For example, the cluster 86 contains three directives 94, 96, 98, which correspond respectively to events 100, 102, 104. The cluster 92 contains only one directive 106, corresponding to an event 108.

When applying the clustering algorithm, the mapping between directives and events is exploited. Every event cluster that is defined matches a set of directives that is grouped together by the clustering algorithm. It is thus possible to construct a coverage query by including conditions of the directives therein. When the query is run, clusters of non-covered events can be defined according to similarities in respective ones of the directives with which the non-covered events are associated. The complexity of the directives 14 are typically limited by the capabilities of the test generator engine 12. Accordingly, the holes identified using this approach indicate practical modifications, rather than theoretical modifications, of the directives.

Operation.

Figure 8:
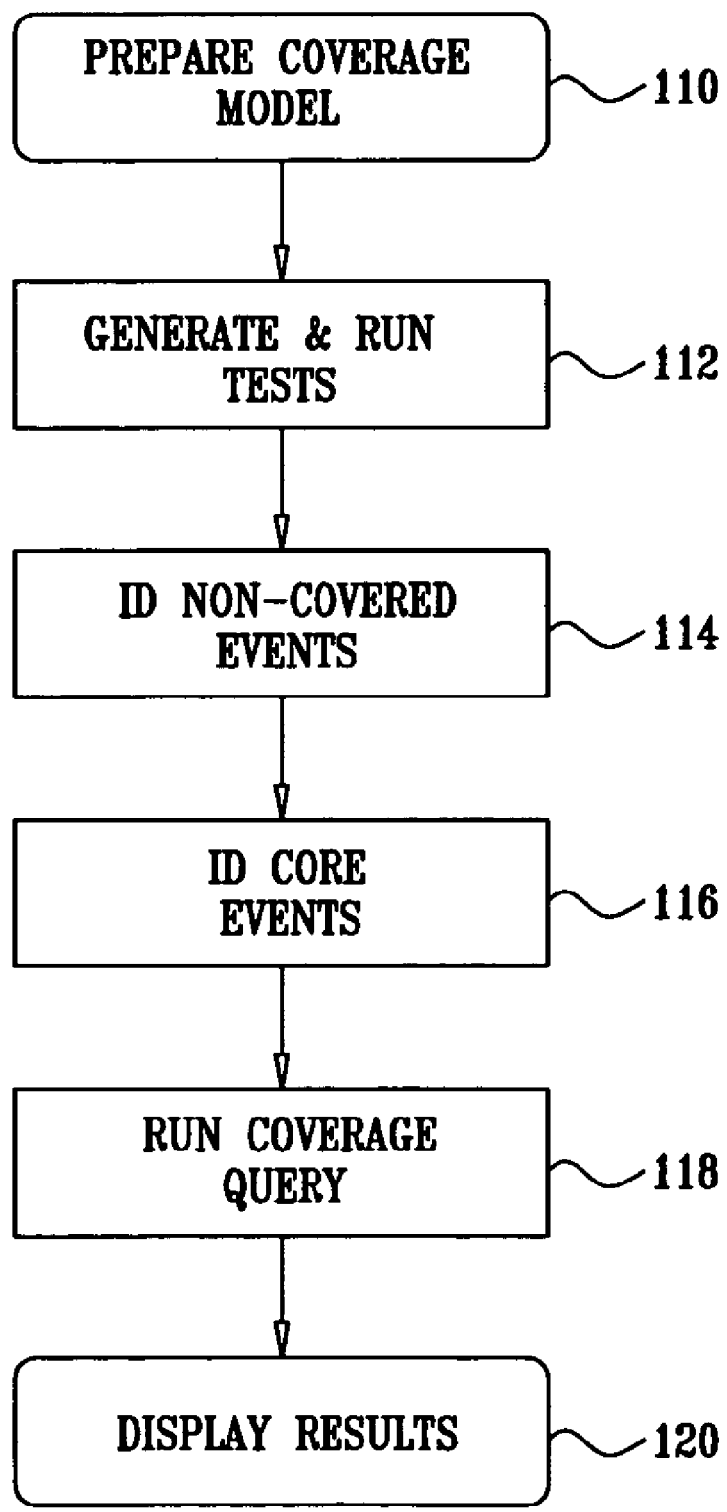
FIG. 8 is a flow chart summarizing a method of functional coverage analysis in accordance with a disclosed embodiment of the invention.

Reference is now made to FIG. 8, which is a flow chart summarizing a method of functional coverage analysis in accordance with a disclosed embodiment of the invention. The method can be executed using the system 20 (FIG. 1). At initial step 110, a coverage model is prepared. This is a set of attributes of a design being verified is represented as a multi-dimensional cross-product space, comprising events corresponding to combinations of values of the attributes.

Next, at step 112 a test generator is invoke to generate and execute one or more tests for the design.

Next, at step 114, using the cross-product representation prepared in initial step 110, non-covered events in test results are identified.

Next, at step 116, a core set of the non-covered events is identified. This step is typically performed manually but may be automated, using known pattern recognition techniques.

Next, at step 118 a coverage query is prepared and executed on the test results. As noted above, the query identifies a hole in the test coverage that satisfies conditions of the coverage query and includes the core set.

Next, at final step 120, the hole is presented together with the test results to display a simplified view of the coverage of the events in the cross-product space.

Example 1

An interdependency model is described with reference to an exemplary design verification project. A coverage model was prepared and hole analysis performed for checking register interdependency in the pipelines of the NorthStar processor. NorthStar is a member of the multithreaded, superscalar PowerPC family of processors developed by IBM.

Figure 9:
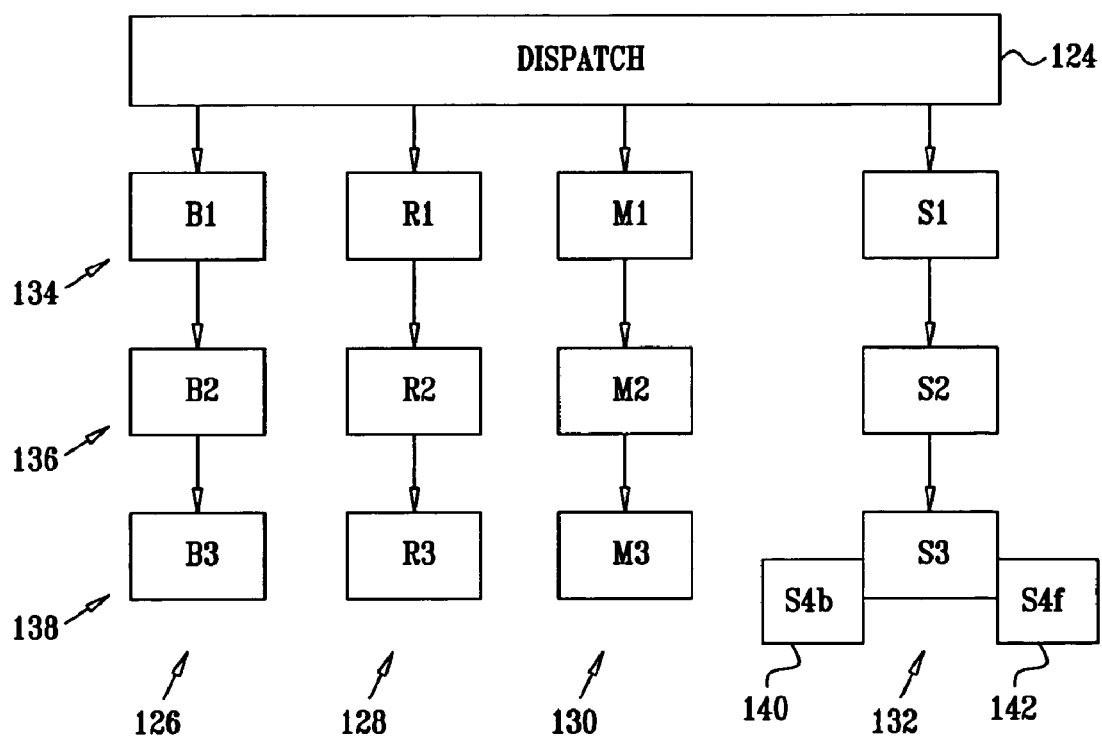
FIG. 9 is a block diagram illustrating execution pipelines of an exemplary processor, which is analyzed according to a disclosed embodiment of the invention.

Reference is now made to FIG. 9, which is a block diagram illustrating an execution pipelines 122 of the NorthStar processor, which is analyzed according to a disclosed embodiment of the invention. The processor includes a dispatch module 124, linked to four execution pipelines: a pipeline BPipe 126, which handles branch instructions, a pipeline Rpipe 128, which handles simple arithmetic instructions, a pipeline Mpipe 130, which deals with complex arithmetic instructions, and a pipeline SPipe 132, which deals with load/store instructions. Single cycle, fixed point arithmetic instructions can be handled either by the pipeline Rpipe 128 RPipe or the pipeline MPipe 130. All other arithmetic instructions, including floating point instructions, are handled by the pipeline MPipe 130. Each pipeline consists of a data fetch stage 134, an execution stage 136, and a write-back stage 138. The load/store pipe has two additional stages 140, 142 that are used for thread switching. The NorthStar processor does not allow out-of-order execution, so all instructions progress through their respective pipelines in the same order in which they appear in the test.

A coverage model was defined to check for register interdependency between two instructions that appear together in the pipeline. The attributes of the model are shown in Table 6. The model consists of seven attributes: the type, pipeline, and stage of one instruction; the type, pipeline, and stage of a second instruction; and the register interdependency that may exist between the two. Two instructions in a pipeline are said to have a register interdependency if they both access the same register during execution.

TABLE 6

Attributes of the Interdependency Model

| Attr | Descr | Values |
|---|---|---|
| $I_1$ | Instr 1 type | FP-ld-simple, FP-st-simple, fix-ld-simple, fix-st-simple, fix-ld-complex, fix-st-complex, FP-M, fix-M, fix-R branch, cache, condition, sync-call-return |
| $P_1$ | Instr 1 pipe | BPipe, RPipe, MPipe, SPipe |
| $S_1$ | Instr 1 stage | 1-5 |
| $I_2$ | Instr 2 type | same as $I_1$ |
| $P_2$ | Instr 2 pipe | same as $P_1$ |
| $S_2$ | Instr 2 stage | same as $S_1$ |
| Dep | Dependency | RR, RW, WR, WW, None |

The model distinguishes read/read (RR), read/write (RW), write/read (WR), and write/write (WW) dependencies, as the first and second instruction cause reading and writing to the register, respectively.

The model looks for coverage of all possible interdependencies (including none) between all combinations of instructions in any possible pipeline stage.

An example of a coverage task in the model is the task <fix-R, RPipe, 2, fix-ld-simple, SPipe, 1, RR>, which corresponds to a simple fixed point instruction in the execution stage 136 of the pipeline Rpipe 128. There is a read/read dependency with a fix-ld-simple instruction in the data fetch stage 134 of the pipeline SPipe 132.

Restrictions in the model arise for various reasons: pipelines dedicated to handle only certain types of instructions; limitations that exist on the pipeline architecture; instructions that never read or write to registers; instructions that are restricted in their dependencies at certain stages of execution; and the fact that out-of-order execution is not supported by the processor. A partial list of restrictions for the interdependency model is shown in Table 7.

TABLE 7

Restrictions for the Interdependency Model.

$I_1(I_2)$ is a simple fixed point instruction
⇒ $P_1(P_2)$ is RPipe or MPipe
$I_1(I_2)$ is a complex fixed point or an FP instruction
⇒ $P_1(P_2)$ = MPipe
$I_1(I_2)$ is a load/store instruction ⇒ $P_1(P_2)$ = SPipe
$I_1(I_2)$ is a branch instruction ⇒ $P_1(P_2)$ = BPipe
$P_1 = P_2$ ⇒ $S_1 \neq S_2$
$P_1(P_2) \neq$ SPipe ⇒ $S_1(S_2) <= 3$
$I_1(I_2)$ is a branch instruction ⇒ Dep = None
$I_1(I_2)$ is a cache or complex store instruction
⇒ Dep ≠ WR (RW)
$S_1 = 2$ and $I_1$ is not a complex load instruction
⇒ Dep ≠ WR
$S_2 = 2$ and $I_2$ is not a store or mtspr instruction
⇒ Dep ≠ WR
$S_1 >= S_2$ After performing hole analysis on the interdependency model, two holes of significance were discovered. The first was the result of a flaw in the test generator that was used to produce the test inputs. The test generator did not consider the fact that a store and update instruction also writes to a register, and therefore, such events were generated with low probability. This flaw was fixed with once the hole was discovered.

The second hole was due to the fact that some tasks need a rare combination of events to occur before they can be observed. The logic that checks dependency between foreground and background threads constitutes about a third of the total pipeline logic, However, when not enough thread switches are created, for example, this logic is not sufficiently tested. The solution was to reduce the timeout between threads and increase the mix of instructions that cause thread switches.

Figure 10:
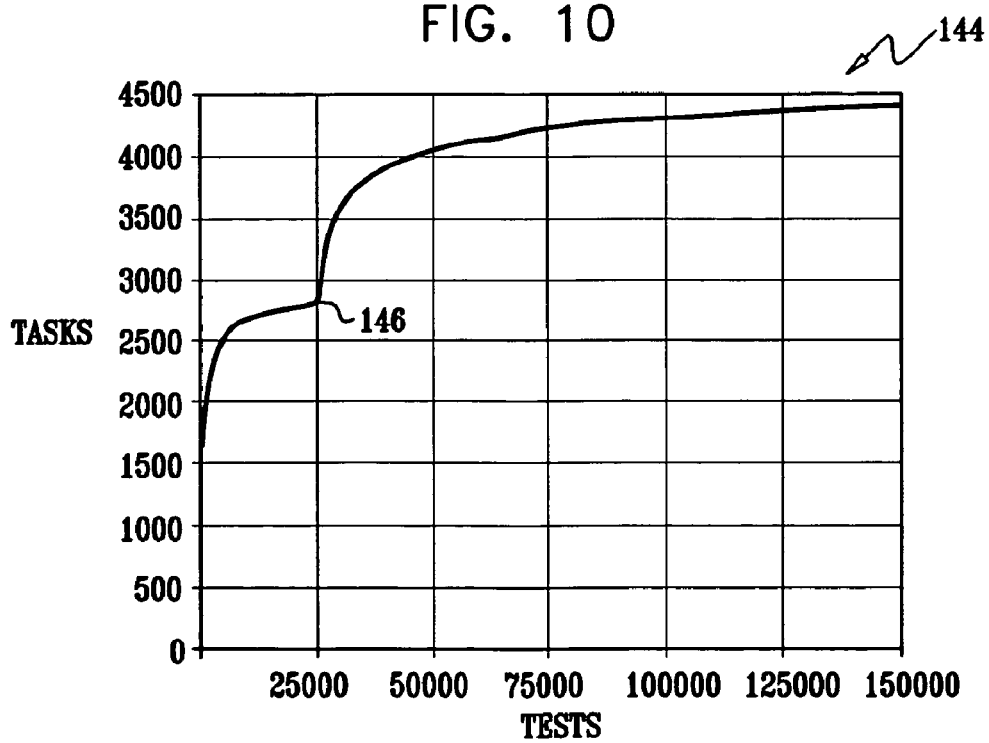
FIG. 10 is a graph illustrating a significant improvement in test coverage following application of a disclosed embodiment of the invention.

Reference is now made to FIG. 10, which is a temporal graph 144 illustrating a significant improvement in test coverage following application of the teachings of a disclosed embodiment of the invention. The improvement in coverage was observed after about 25,000 tests were measured. Then, at a point 146, the aforementioned corrective changes were made on account of the two holes. The project then continued, as shown in the graph. While the test generator was capable of generating events reflecting the corrective changes in its native mode of operation, the likelihood of doing so unintentionally was low. Therefore, in order to improve coverage, the test generator was instructed by the verification engineer to concentrate on the corner cases relating to the two holes.

It will be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art, which would occur to persons skilled in the art upon reading the foregoing description.

COMPUTER PROGRAM LISTINGS

Listing 1 - Projected Holes Algorithm

```
Data    : set T of covered tasks
Result  : list of projected holes
// mark phase
foreach t ∈ T do
    if t is not marked then
        mark t
        recursively mark all ancestors of t
    end
end
// report phase
for i = k downto 0 do
    foreach subspace v with dimension i do
        if v is not marked then
            report v as hole
            recursively mark all descendants of v
        end
    end
end
```

The invention claimed is:

1. A computer-implemented method for presentation of functional coverage, comprising:
   representing, using a computer, a set of attributes of a design being verified as a multi-dimensional cross-product space, comprising events corresponding to combinations of values of said attributes;
   running, using the computer, at least one test on said design;
   identifying, using the computer, non-covered events in test results of said test;
   specifying, using the computer, a core set of said non-covered events;
   performing, using the computer, a coverage query on said test results to identify a hole in said functional coverage by said test results that satisfies conditions of said coverage query and includes said core set, wherein said coverage query comprises a definition of said core set and further comprises properties of said hole; and
   presenting, using the computer, said hole so as to display a view of said coverage of said events in said cross-product space.

2. The method according to claim 1, wherein said coverage query comprises a property of said test results.

3. The method according to claim 1, wherein said step of performing a coverage query comprises performing an aggregation procedure that begins with said core set to identify a largest hole around said core set that satisfies said conditions of said coverage query.

4. The method according to claim 1, further comprising the step of preparing test directives, wherein said step of running at least one test is performed in accordance with said test directives; and
   constructing said coverage query by including conditions of at least a portion of said test directives therein.

5. The method according to claim 4, further comprising the step of: after performing said coverage query, identifying ones of said test directives associated with said hole.

6. The method according to claim 1, wherein said step of performing a coverage query comprises identifying a projected hole in said non-covered events.

7. A computer software product, comprising a non-transitory computer-readable storage medium storing computer executable instructions which, when executed by a computer cause the computer to perform a method for presentation of functional coverage, comprising:
  representing a set of attributes of a design being verified as a multi-dimensional cross-product space, comprising events corresponding to combinations of values of said attributes;
  running at least one test on said design;
  identifying non-covered events in test results of said test;
  specifying a core set of said non-covered events;
  performing a coverage query on said test results to identify a hole in said functional coverage by said test results that satisfies conditions of said coverage query and includes said core set, wherein said coverage query comprises a definition of said core set and further comprises properties of said hole; and
  presenting said hole so as to display a view of said coverage of said events in said cross-product space.

8. The computer software product according to claim 7, wherein said step of performing a coverage query comprises performing an aggregation procedure that begins with said core set to identify a largest hole around said core set that satisfies said conditions of said coverage query.

9. The computer software product according to claim 7, wherein said step of performing a coverage query comprises performing a clustering algorithm on said non-covered events to find a superset of non-covered events around said core set.

10. The computer software product according to claim 7, wherein said step of performing a coverage query comprises automatically identifying individual ones of said non-covered events and holes of said non-covered events that have a quantitative similarity.

11. The computer software product according to claim 7, wherein said step of performing a coverage query comprises grouping holes of said non-covered events that are similar according to a semantic partitioning of said values of said attributes.

12. The computer software product according to claim 7, wherein said computer is further instructed to perform the steps of:
  identifying lightly covered sets of said events, wherein a percentage of covered ones of said events in said lightly covered sets is less than a predefined threshold; and
  identifying a projected hole in said lightly covered sets.

13. A computer system for presentation of functional coverage, comprising:
  a processor;
  a memory for storing a representation of a set of attributes of a design being verified as a multi-dimensional cross-product space, comprising events corresponding to combinations of values of said attributes;
  a simulator operative for running at least one test on said design;
  a coverage tool executed by said processor and operative for performing the steps of:
  identifying non-covered events in test results of said test;
  accepting a specification of a core set of said non-covered events; and
  performing a coverage query on said test results to identify a hole in said functional coverage by said test results that satisfies conditions of said coverage query and includes said core set, wherein said coverage query comprises a definition of said core set and further comprises properties of said hole; and
  a display linked to said processor and receiving instructions for presenting said hole so as to display a view of said coverage of said events in said cross-product space.

* * * * *